United States Patent [19]
Juergensen et al.

[11] Patent Number: 5,303,407
[45] Date of Patent: Apr. 12, 1994

[54] DIGITAL SQUELCH TAIL CIRCUIT FOR TWO-WAY RADIO COMMUNICATION SYSTEMS

[75] Inventors: Peter W. Juergensen, Fort Worth, Tex.; James D. Brake, Canton, Mich.

[73] Assignee: Motorola, Inc., Schaumburg, Ill.

[21] Appl. No.: 787,488

[22] Filed: Nov. 4, 1991

[51] Int. Cl.$^5$ ............................................... H04B 1/16
[52] U.S. Cl. ..................................... 455/222; 455/220
[58] Field of Search ............... 455/218, 219, 220, 221, 455/222, 223, 224, 225, 212, 213, 35.1; 375/104

[56] References Cited

U.S. PATENT DOCUMENTS

| | | | |
|---|---|---|---|
| 4,430,742 | 2/1984 | Milleker et al. | 375/104 |
| 4,510,624 | 4/1985 | Thompson et al. | 455/223 |
| 4,724,545 | 2/1988 | Hamada | 455/218 |

FOREIGN PATENT DOCUMENTS

| | | | |
|---|---|---|---|
| 0298120 | 12/1990 | Japan | 455/222 |
| 0198434 | 8/1991 | Japan | 455/222 |

Primary Examiner—Reinhard J. Eisenzopf
Assistant Examiner—Chi Pham
Attorney, Agent, or Firm—Jon P. Christensen

[57] ABSTRACT

A squelch tail circuit (20) is provided capable of incorporation within integrated circuit structures. A digital timer (26 and 27) provides a time delay based upon a feed-back comparison providing a long time delay to weak signals and a short time delay to strong signals. A comparator (22) is provided to activate the time delay upon signal loss.

9 Claims, 3 Drawing Sheets

| 4-bit bus value | DAC output voltage |
| --- | --- |
| 0000 | 2.5000 |
| 0001 | 2.0000 |
| 0010 | 1.9375 |
| 0011 | 1.8750 |
| 0100 | 1.8125 |
| 0101 | 1.7500 |
| 0110 | 1.6875 |
| 0111 | 1.6250 |
| 1000 | 1.5625 |
| 1001 | 1.5000 |
| 1010 | 1.4375 |
| 1011 | 1.3750 |
| 1100 | 1.3125 |
| 1101 | 1.2500 |
| 1110 | 1.1875 |
| 1111 | 0.0000 |

*FIG. 3*

| HCOMP output | Hysteresis Voltage |
| --- | --- |
| high (signal detect) | 1.21875 |
| low (no RF signal) | 1.46875 |

*FIG. 4*

DIGITAL SQUELCH TAIL CIRCUIT FOR TWO-WAY RADIO COMMUNICATION SYSTEMS

FIELD OF THE INVENTION

This invention relates to communication systems and more specifically to radio communication systems.

BACKGROUND OF THE INVENTION

Squelch tail circuits are known. Squelch tail circuits are used in simplex radios, such as those typically in service with police or fire departments, to mute the audio portion of a receiver following reception of a communicated signal.

Simplex radios are typically constructed to transmit upon activation of a push-to-talk (PTT) button and receive upon release of the PTT button. For an operator to receive a communicated signal, the simplex radio must detect the incoming signal and unmute the audio portion of the receiver.

The signal detection function in simplex radios is typically based upon signal strength measurements. If a detected signal is above a threshold then an un-mute signal is sent to the receiver un-muting the audio portion of the receiver. At the end of the communicated signal the loss of signal must be detected and the receiver again muted (squelched) to avoid annoying bursts of noise.

While the threshold method of muting works well, problems arise under weak signal conditions. Under weak signal conditions and if the threshold is set too high, fluctuations in detected signal level may result in the radio muting prematurely. If the radio mutes prematurely, before the end of the transmission, portions of the communicated signal will be lost. If, on the other hand, the threshold is set too low then, upon termination of the signal, the radio may not mute.

The solution to the problem of weak signal muting has in the past been provided by a variable time delay on muting after signal loss. The variable time delay is important because as the signal becomes weaker the percentage of time that the signal exceeds a threshold may decrease. A variable time delay may allow a very weak signal to fade in an out due to signal fluctuations without prematurely muting.

The variable time delay on muting a simplex radio is provided by a squelch tail circuit. A squelch tail circuit varies the time delay on muting, depending on detected signal strength. A squelch tail circuit upon detecting a strong signal may mute immediately after loss of signal. Upon detecting a weak signal the squelch tail circuit may provide a relatively long time delay before muting since loss of signal may represent fluctuations in received signal.

A squelch tail circuit typically measures the magnitude of out-of-voice-band noise present on an audio channel (as a measure of signal strength) and, based upon the detected level of noise, adjusts a time delay for activation of the mute function. For signals with a very low level of detected out-of-band noise (strong signals) the delay is very short. For signals with a very high level of out-of-band noise (weak signals) the delay is relatively long.

Shown in FIG. 1 is a schematic of a prior art squelch tail circuit. Used as an input for the squelch circuit is a Squelch Noise Input signal comprised of rectified out-of-voice-voice-band signal components from a limiter (not shown). The rectified out-of-voice-band signal can be assumed to be near 0 v for a very strong signal (significant quieting) and may be as high as 2.5 v for a weak signal (very little quieting).

The squelch tail circuit is enabled (the audio portion of the simplex radio is un-muted) by the presence of a relatively low level signal at the Squelch Noise Input terminal. Enablement of the circuit occurs through activation of the hysteresis comparator. The hysteresis comparator is activated by the presence of a relatively small DC voltage presented at the minus (−) terminal of the hysteresis comparator (indicating the presence of a carrier). Activation of the hysteresis comparator, in turn, activates the current enable and changes the output voltage of the squelch detect voltage reference.

The current enable enables the current follower. Enablement of the current follower causes the output of the current follower to output a current proportional to the voltage difference between the Squelch Noise Input signal and the capacitor causing the capacitor to charge to a value substantially equal to the Squelch Noise Input signal.

Deactivation of the current follower causes the current follower to present a substantially open-circuit condition to the resistor-capacitor (RC) network connected to the output of the current follower and the plus (+) input to the squelch detect comparator. Deactivation of the current follower allows the capacitor to discharge through the resistor. Discharge of the capacitor causes the capacitor voltage to eventually equal a first threshold voltage found at the output of the squelch detect voltage reference. As the plus (+) input to the squelch detect comparator drops below the minus (−) input to the squelch detect output comparator the output of the squelch detect comparator reverses causing the squelch detect circuit to provide a mute signal to the receiver of the radio circuit.

In operation a strong signal presented to the radio would present a relatively low voltage signal to the Squelch Noise Input and, in turn, charge the capacitor to a relatively low voltage. At the end of a transmission the DC signal at the Squelch Noise Input would rise to a high level causing the hysteresis comparator to disable the follower comparator (presenting an open circuit by the current follower to the RC network). Since the capacitor was charged to a relatively low level the output of squelch detect comparator would quickly shift to a muted state.

In the case of a weak signal presented to the radio a relatively large DC voltage would be present at the Squelch Noise Input terminal and the capacitor would charge to the relatively high level. At the end of the transmission the hysteresis comparator would detect the end of transmission and disable the current follower. Since the capacitor is charged to a relatively high level a relatively long capacitor discharge time must now pass before the capacitor voltage equals the first threshold. If the hysteresis comparator were to re-detect a signal then the current follower would again be enabled and the capacitor would recharge.

As described above use of the squelch tail circuit may provide a relatively long period from loss-of-signal to mute under weak signal conditions. The relatively long time period is beneficial in the control of simplex radios under weak signal conditions.

While the squelch tail circuit has provided reliable performance the squelch tail circuit does not lend itself to miniaturization or to modern manufacturing practice.

The need for relatively long squelch tail periods requires the use of a relatively large capacitor (2.2 microFarads). Furthermore, time constants relying on RC networks exhibit poor consistency due to manufacturing variations inherent in on-chip resistors. A smaller capacitor, offering comparable performance, requires a larger resistor. Large capacitors or resistors are difficult to construct using integrated circuit construction techniques. A need exists for a way of constructing a squelch tail circuit offering comparable performance yet compatible with integrated circuit manufacturing capabilities.

SUMMARY OF THE INVENTION

A radio squelch tail circuit providing a variable squelch delay is described. The squelch tail circuit contains a means for determining a squelch delay time based, at least in part, upon a magnitude of a squelch noise input signal. The circuit also contains a means for entering the determined squelch delay time into a digital timer and a means for activating the timer upon loss of RF signal. A means is also provided for a squelch tail output signal upon expiration of the squelch delay.

BRIEF DESCRIPTION OF THE DRAWING

FIG. 3 comprises a list of DAC output values versus counter logical states.

FIG. 4 comprises a list of output reference voltages for a RF signal detector.

BRIEF DESCRIPTION OF A PREFERRED EMBODIMENT

The solution to the problem of designing a squelch tail circuit that may be included within an integrated circuit lies, conceptually, in replacing the RC network with a digital timer device including a counter device and clock and wherein the desired time delay can be achieved by entering a number into the counter and indexing the counter by application of the clock signal to some detected counter threshold number.

Figure 1:
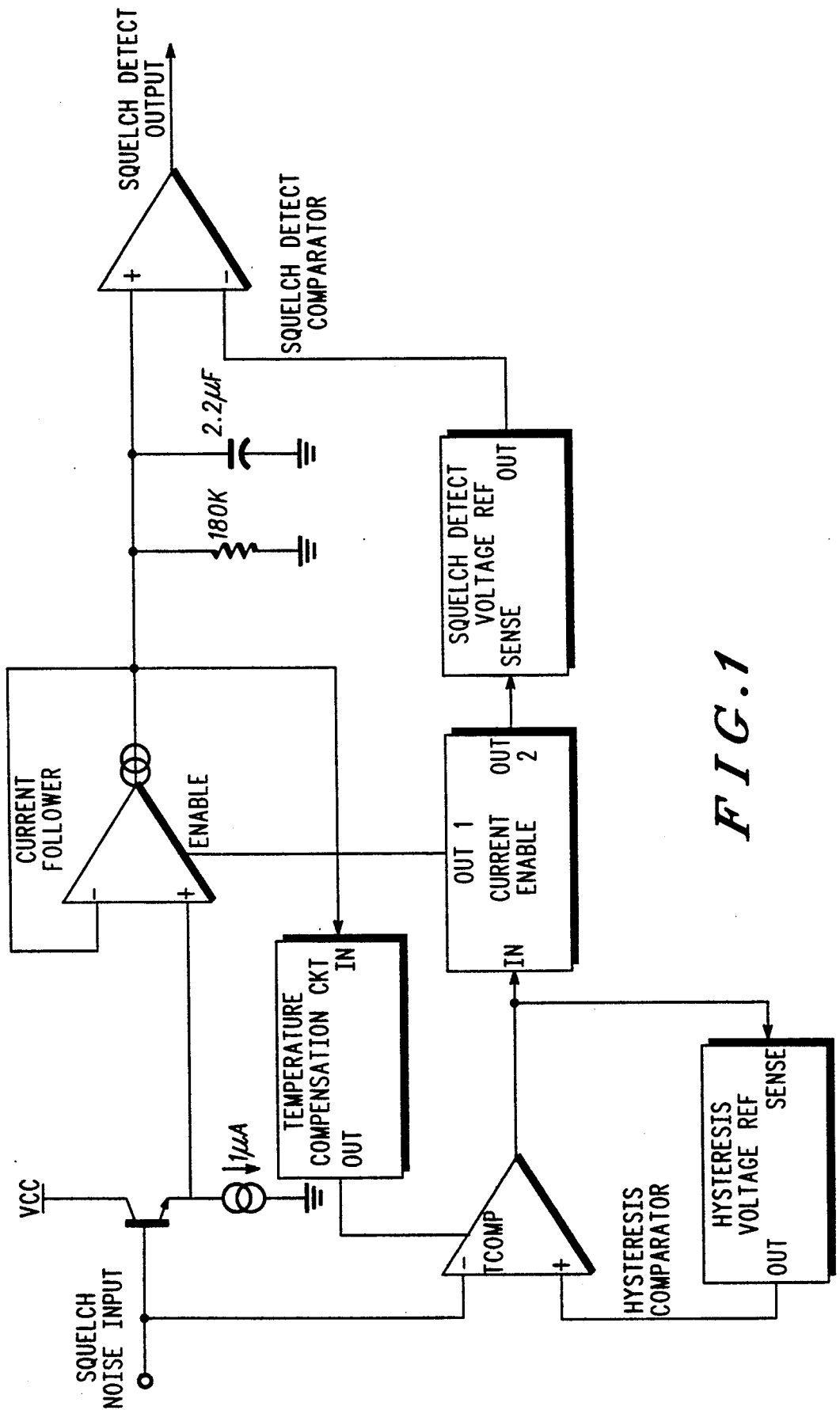
FIG. 1 depicts a prior art analog squelch tail circuit.
Figure 2:
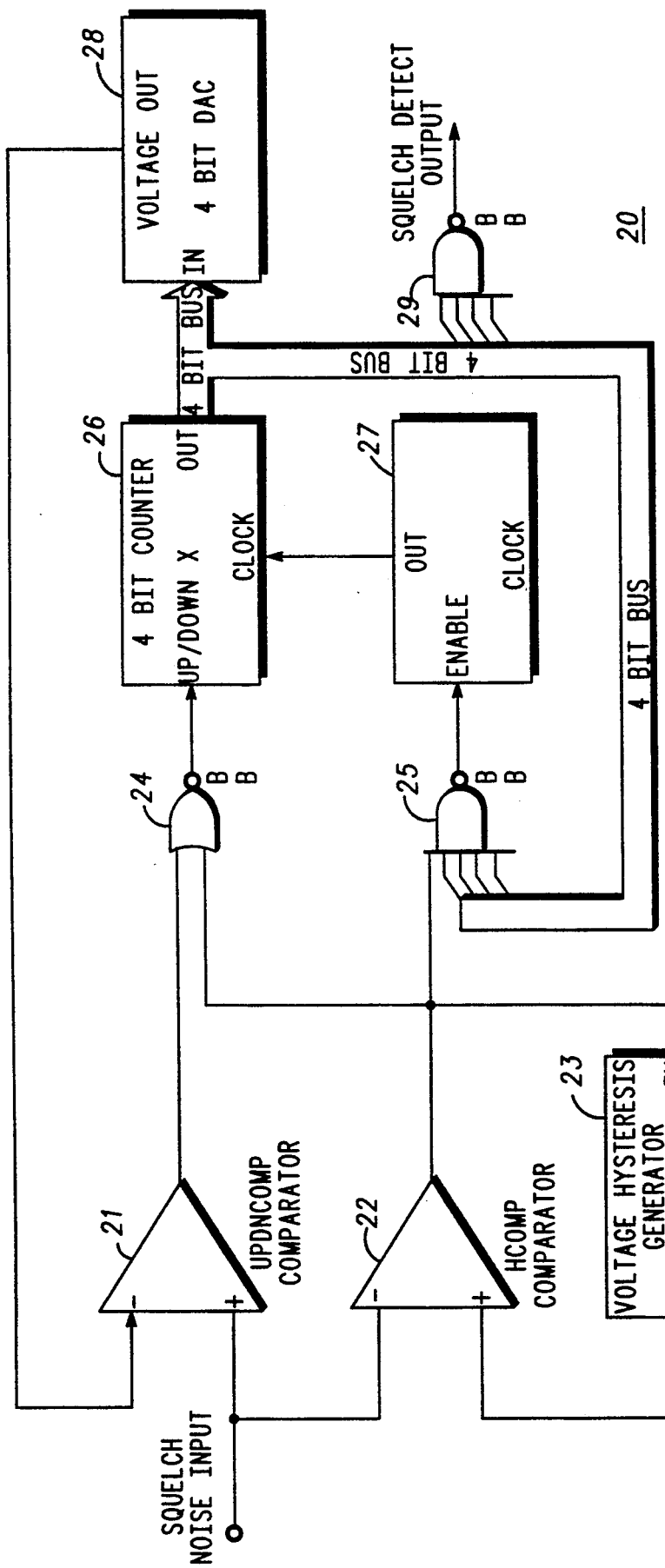
FIG. 2 depicts schematic of a digital squelch tail circuit under the invention.

Shown, generally, in FIG. 2 is a schematic (20) of a fully integrated squelch tail circuit according to the invention. Included within the squelch tail circuit (20) is an UPDNCOMP comparator (21), a HCOMP comparator (22), NOR gate (24), NAND gates (25 and 29), UP/DOWN counter (26), CLOCK (27), a four bit DAC (28), and a voltage hysteresis generator (23).

The blocks shown in FIG. 2 are well known in the art. No further description need be, or will be, offered, relative to the blocks, beyond that necessary to an understanding of the invention.

The squelch tail circuit (20) may provide an output at a Squelch Detect Output depending on a DC signal present at a Squelch Noise Input. The DC signal present at the Squelch Noise Input is derived from signal processing of out-of-voice-band signal components of a received signal and is inversely proportional to the magnitude of such components. The DC signal level at the Squelch Noise Input may be near 0 v for a no-carrier-signal condition and 2.5 v for a strong signal condition.

Shown in FIG. 4 is a list of output reference voltages used in the activation and deactivation of the squelch tail circuit (20). The output reference voltages are developed on the output (HYST REF OUT) of the voltage hysteresis generator (23) depending on the DC level of the Squelch Noise Input. Under low input DC voltage conditions (no RF) the voltage hysteresis generator (23) produces a first threshold reference voltage of 1.46875 v (FIG. 4). Under high DC level conditions (RF signal detected) at the Squelch Noise Input the voltage hysteresis generator (23) produces a second threshold reference voltage of 1.21875 v (FIG. 4).

HCOMP comparator (22), under the control of the first and second reference voltages applied to the plus (+) terminal from the voltage hysteresis generator (23), acts as a squelch tail circuit, threshold switch with hysteresis. HCOMP comparator remains in the "off" state, with the output (OUT) producing a logical "1" under conditions of no RF signal. The logical "1" on the output of the HCOMP comparator (22) causes the voltage hysteresis generator (23) to output the first reference voltage (1.46875 v).

HCOMP comparator (22) remains in the "off" state until the DC signal level at the Squelch Noise Input rises above the first reference voltage (1.46875 v). When the DC level at the Squelch Noise Input rises above 1.46875 v the HCOMP comparator "detects" the presence of a RF signal and shifts to the "on" state (logical 0 at OUT). The logical 0 on the output of the HCOMP comparator (22) causes the voltage hysteresis generator (23) to output the second reference voltage (1.21875 v).

Upon activation the HCOMP comparator (22) remains in the "on" state until the Squelch Noise Input voltage falls below the second reference voltage of 1.21875 v. The difference between the first and second threshold voltages (1.46875-1.21875 v) provides a hysteresis of 0.25 v in the detection of RF signals.

With the HCOMP comparator (22) in the "off" state and the radio muted, the level of the Squelch Detect Output remains substantially 0 v. The squelch tail circuit (20) is maintained in the inactive state by a relatively low DC level on the Squelch Noise Input.

To produce 0 v on the Squelch Detect Output, the NAND gate (29) receives all 1's on its inputs from the 4-bit bus. To produce a 1 on each input from the 4-bit bus requires that the number 15 (1111 in binary) be present on the 4-bit bus and within the UP/DOWN counter (26). The number (15) present within the counter and providing the Squelch Detect Output signal represents a detected counter threshold number. The detected counter threshold number is used to provide a Squelch Detect Output signal and to disable the CLOCK (27) of the squelch tail circuit (20) during inactive periods.

The number 15 is maintained within the UP/DOWN counter (26) by the absence of an "clock" input from the clock (27). The clock (27) is disabled by a "0" input from the NAND gate (25). The "0" input provided by the NAND gate (25) is derived by virtue of the number, 15, on the 4-bit bus and by virtue of a 1 output from the HCOMP comparator (22) through the NAND gate (25).

In the inactive state, the output (VOLTAGE OUT) of the 4-bit DAC (28), by virtue of application of the number 15 to the input terminal (IN), remains at a low level. Shown in FIG. 3 is a list of output voltages appearing at VOLTAGE OUT of the 4-bit DAC (28) based upon the number present on the 4-bit bus. As can be seen from the table (FIG. 3), 4-bit DAC (28) produces a maximum voltage (2.5 v) on 4-bit bus number 0 and a minimum voltage (0 v) on 4-bit bus number 15. (Since the bus number represents the logical state of the counter (26) the number on the bus will hereinafter sometimes be referred to in terms of the logical state of the counter (26).

The output (VOLTAGE OUT) of the 4-bit DAC (28) is applied to the minus (−) input of the UPDNCOMP comparator (21). Application of the very low voltage to the minus (−) input of the UPDNCOMP comparator (21) during the inactive state results in a logical 1 at the output (OUT) of the UPDNCOMP comparator (21) at the instant of detection of an RF carrier (the instant that the Squelch Noise Input DC signal level exceeds the first threshold).

Upon detection of an RF carrier at the Squelch Noise Input the output (OUT) of the HCOMP comparator (22) shifts to a logical 0. Application of a logical 0 to the input of the NAND gate (25) causes the clock (27) to be enabled by application of a logical 1 to the input (ENABLE) terminal.

Detection of an RF carrier also results in a logical 0 on the input of NOR gate 24. The logical 0 from the HCOMP comparator (22) and logical 1 from the UPDNCOMP comparator (21) results in a logical 0 on the output of the NOR gate (24) and the input (IN) of the 4-bit counter (26).

The logical 0 on the input (IN) of the 4-bit counter (26) and the clock signal from the clock (27) causes the 4-bit counter (26) to begin counting down from 15. As the 4-bit counter (26) counts down from 15 the decrementing number on the 4-bit bus causes the output (VOLTAGE OUT) of the 4-bit DAC (28) to rise (see FIG. 3). The 4-bit counter (26) continues to count down until the proper logical state is entered within counter (26) causing the output (VOLTAGE OUT) of the 4-bit DAC (28) to exceed the Squelch Noise Input Signal.

As an example, if the Squelch Noise Input signal were to were to equal the first threshold voltage (1.46875 v) then the 4-bit counter (26) would continue to index on each clock pulse until the number 9 were reached (binary number 1001). Upon reaching the number 9 the voltage output of the 4-bit DAC would equal 1.5 v. At logical state 9 of the 4-bit counter (26) the output voltage of the DAC (28) (1.5 v) applied to the minus (−) input to the UPDNCOMP comparator (21) would exceed the voltage on the plus (+) input (1.46875 v) and would cause the output of the UPDNCOMP comparator (21) to go to a logical 0. A logical 0 on the output of the UPDNCOMP comparator (21) would cause a logical 1 on the input to the 4-bit counter (26).

The logical 1 on the input to the 4-bit counter (26) would cause the 4-bit counter (26) to begin incrementing. After one increment, however, the counter (26) would contain the number 10 and the DAC (28) output voltage (FIG. 3) would equal 1.4375 v. Application of the 1.4375 v to the minus input of the UPDNCOMP comparator (21) would again cause the output of the comparator (21) to change. If the Squelch Noise Input signal remained at the first threshold voltage the counter (26) would index between the numbers 9 and 10. DAC (28) acting in conjunction with UPDNCOMP comparator (21) provide a determining means of the proper logical state of the counter (26) and as a means for entering a squelch delay time (as determined by the logical state) into the counter (26).

If, instead of remaining at the first threshold, the Squelch Noise Input signal should change then the counter (26) in the above manner would track the Squelch Noise Input signal through the DAC (28) and the UPDNCOMP comparator (21). Tracking of the Squelch Noise Input signal by the counter (26) and DAC (28) is dependent upon clock speed. In one embodiment of the invention clock speed is adjusted to 16 milliseconds per clock pulse. The 16 millisecond clock rate would establish a 16 millisecond index rate within the counter (26).

Upon loss of the RF signal the Squelch Noise Input rapidly decreases to a very low level. The HCOMP comparator (22) detects the decrease below the second threshold (1.21875) and immediately shifts to the "off" state, outputting a logical 1.

The presence of a 1 on the input to the NOR gate (24) from the output (OUT) of the HCOMP comparator (22) causes the NOR gate (24) output to go to 0. The 0 on the output of the NOR gate (24) causes the 4-bit counter (26) to begin counting down.

The 4-bit counter (26) continues to count down as long as a clock signal is present on the clock input (CLOCK) of the 4-bit counter (26). The CLOCK (27) continues to provide a clock input to the 4-bit counter (26) as long as the enable input (ENABLE) of the CLOCK (27) has a logical 1 applied to it.

The logical 1 applied to the enable input (ENABLE) of the CLOCK (27) is provided by the output of the NAND gate (25). The output of the NAND gate (25) remains high as long as a 0 is present on any of its inputs. Since the input from the HCOMP comparator, in the above example, has already shifted to a logical 1 (upon loss of RF signal) the only other source of a 0 on the input of the NAND gate (25) is from the 4-bit bus.

The presence of 0's on the input to the NAND gate (25) can be best understood by reference to the 4-bit bus values in FIG. 3. In the above example, before loss of RF the 4-bit bus was alternating between states 9 and 10 (1001 and 1010). In either case 0's are provided on at least 2 inputs to the NAND gate (25) from the 4-bit bus. The presence of the 0's on the input of the NAND gate (25) causes the CLOCK (27) to continue to run and the 4-bit counter (26) to continue to decrement.

As the 4-bit counter (26) decrements, a 0 continues to be present on at least one input of the NAND gate (25) as the 4-bit counter (26) decrements from 9 to 0. As the 4-bit counter (26) decrements to a value of 0 the 4-bit bus provides 0's on each input to the NAND gate (25). On the next decrement of the 4-bit counter (26) the value within the counter (26) decrements from 0 (0000) to 15 (1111). As the 4-bit counter (26) decrements to 15 all 1's are applied from the 4-bit bus to the inputs of the NAND gate (25). Since the remaining input to the NAND gate (25) from the HCOMP comparator (22) is also a 1 the output of the NAND gate (25) now goes to 0, disabling the CLOCK (27).

Upon reaching state 15, and disabling the CLOCK (27), the 4-bit counter (26) stops decrementing. The output (Squelch Detect Output) of the Squelch Tail Circuit (20) in state 15 goes to logical 0 through application of all 1's at the input to NAND gate 29. Upon reaching state 15 within the 4-bit counter (26) and with the HCOMP comparator (22) in the "off" state, the Squelch Tail Circuit (20) has reached the "off" state and has muted the radio through the logical 0 present on the Squelch Detect Output.

The squelch tail time, between loss of RF signal can be determined from the state of the 4-bit counter (26) when the RF signal was lost. The state that the counter (26) is in upon signal loss represents a squelch delay time calculated by the difference in the number of states between when the signal is lost and state 15. In the above example, if the 4-bit counter (26) was in state 9 upon loss of signal then the counter (26) decrements through 10 states (state 9 through state 15) before expiration of squelch delay. At a clock rate of 16 milliseconds the 10 states provided a 160 millisecond delay between loss of RF signal and radio muting.

If, in the above example, before the 4-bit counter (26) reaches state 15, the HCOMP comparator (22) again detects an RF signal (Squelch Noise Input exceeds 1.46875 v) then the 0 is provided at the output (OUT) of the HCOMP comparator (22). The 0 at the output (OUT) of the HCOMP comparator (22) enables the CLOCK (27) through NAND gate 25 and the 4-bit counter (26) through NOR gate 24. in such case the 4-bit counter (26) may begin indexing upwards to track the Squelch Noise Input DC signal with the output (VOLTAGE OUT) of the 4-bit DAC (28).

As a further example, if the DC level of the Squelch Noise Input, after activation of the Squelch Tail Circuit (20) should fall to a level very close to the second threshold (1.21875) before signal loss occurs then a different, longer time delay may be provided. The longer time delay occurs because of the different state of the 4-bit counter (26) upon signal loss.

The state of the 4-bit counter (26) depends on the DC level of the Squelch Noise Input. If the Squelch Noise Input were very close to the second threshold (1.21875 v) then the 4-bit counter (26) would be alternating between states 13 and 14 (1101 and 1110). If signal loss occurred in state 13 then the 4-bit counter (26) would decrement through 14 states before muting. Decrementing through 14 states would provide 224 milliseconds of delay before muting. As above, if the RF signal were re-detected before expiration of the 224 millisecond delay then the counter (26) would again begin tracking the re-detected signal.

We claim:

1. A radio squelch delay circuit for providing a variable squelch delay, such circuit comprising:
   A) a digital to analog converter receiving an input from a counter and providing an output to a comparator comparing the digital to analog converter output with a squelch noise input signal to provide an up/down count control input to the counter for determining a squelch delay time based, at least in part, upon a magnitude of the squelch noise input signal;
   B) means for entering the determined squelch delay time into a digital timer comprising the counter operatively coupled to a clock;
   C) means for activating the timer upon loss of RF; and,
   D) means coupled to an output of the digital timer for providing a squelch tail circuit output signal upon expiration of the squelch delay.

2. A method for providing a squelch delay within a radio, such method comprising the steps of:
   A) determining a squelch delay time by receiving an input from a counter by a digital to analog converter and providing an output to a comparator, and comparing the digital to analog converter output with a squelch noise input signal in the comparator, and, providing an up/down count control input to the counter;
   B) entering the determined squelch delay time into a digital timer;
   C) activating the timer upon loss of RF by comparing the squelch noise input signal with a threshold and upon the squelch noise input signal exceeding the threshold providing an output activating the timer; and,
   D) providing a squelch tail circuit output signal upon expiration of the squelch delay.

3. A radio squelch tail circuit providing variable squelch delay based on signal strength, such circuit comprising:
   A) counter means with an up/down control input;
   B) means for entering a squelch delay number, determined at least in part from a magnitude of a squelch noise input signal, into the counter means, a clock signal provided at an input to the counter means from a clock operating at an index rate, a comparator comparing the squelch noise input signal with a digital to analog converter representation of the counter contents and an output of the comparator interconnected with the up/down control input of the counter means;
   C) means coupled to the counter means for indexing the counter from the squelch delay number to a counter threshold number, at the index rate, when the squelch noise input signal exceeds a signal threshold; and,
   D) means coupled to the counter means for detecting the counter threshold number as an output of the squelch tail circuit.

4. A radio squelch tail circuit providing variable squelch delay based on signal strength, such circuit comprising:
   A) counter means;
   B) means coupled to the counter means for entering a squelch delay number, determined at least in part from a magnitude of a squelch noise input signal, into the counter means;
   C) means coupled to the counter means for indexing the counter from the squelch delay number to a counter threshold number, at an index rate, when the squelch noise input signal exceeds a signal threshold; and,
   D) a logic gate connected to a data bus receiving data from the counter means for detecting the counter threshold number.

5. In a radio squelch tail circuit a method of providing variable squelch delay based on signal strength, such method comprising the steps of:
   A) entering a squelch delay number, determined at least in part from a magnitude of a squelch noise input signal, into a counter means and a clock signal to a count input of the counter;
   B) indexing the counter from the squelch delay number to a counter threshold number, at an index rate determined by the clock signal at the count input to the counter while controlling an up/down control input of the counter through a NOR gate with an output signal of a first and second comparators, when the squelch noise input signal exceeds a signal threshold;
   C) detecting the counter threshold number.

6. The method as in claim 5 wherein the step of entering a squelch delay number further includes the step of comparing, by the first comparator, a squelch noise input signal with an output of a DAC receiving as a DAC input from an output of the counter.

7. The method as in claim 5 wherein the step of indexing the counter from the squelch delay number to the counter threshold number further includes the step of comparing, by the second comparator, the squelch noise input signal with the signal threshold and when the squelch noise input signal exceeds the threshold providing a signal to the up/down control input through the NOR gate indexing the counter from the squelch delay number to the counter threshold number.

8. The method as in claim 5 wherein the step of detecting the counter threshold number further includes the step of comparing a counter number with the counter threshold number through use of a logic gate connected to a data bus receiving data from the counter.

9. The method as in claim 8 wherein the step of comparing a counter number with the counter threshold number through use of a logic gate further includes the step of providing a squelch tail circuit output through operation of the logic gate when the counter number exceeds the counter threshold number.

* * * * *